United States Patent
Weng et al.

(10) Patent No.: US 7,854,535 B2
(45) Date of Patent: Dec. 21, 2010

(54) CERAMIC PACKAGING FOR HIGH BRIGHTNESS LED DEVICES

(75) Inventors: Lee Kong Weng, Penang (MY); Ng Kee Yean, Penang (MY); Lee Meng Ee, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 889 days.

(21) Appl. No.: 10/669,986

(22) Filed: Sep. 23, 2003

(65) Prior Publication Data

US 2005/0063187 A1 Mar. 24, 2005

(51) Int. Cl.
*F21V 7/00* (2006.01)
(52) U.S. Cl. .................. 362/296.07; 362/800; 362/341
(58) Field of Classification Search ................ 362/296, 362/800, 545, 546, 249, 327, 341; 313/113, 313/114
See application file for complete search history.

(56) References Cited

U.S. PATENT DOCUMENTS

| | | | |
|---|---|---|---|
| 1,340,443 A * | 5/1920 | Gleason ...................... 362/308 |
| 3,780,357 A | 12/1973 | Haitz |
| 3,821,590 A * | 6/1974 | Kosman et al. ............. 313/499 |
| 4,600,977 A * | 7/1986 | Barlian et al. ............... 362/392 |
| 4,769,345 A | 9/1988 | Butt et al. |
| 5,177,593 A | 1/1993 | Abe |
| 5,317,196 A | 5/1994 | Wong |
| 5,686,790 A * | 11/1997 | Curtin et al. ................ 313/493 |
| 5,907,151 A | 5/1999 | Gramann et al. |
| 6,186,649 B1 * | 2/2001 | Zou et al. .................... 362/347 |
| 6,204,523 B1 | 3/2001 | Carey et al. |
| 6,355,946 B1 | 3/2002 | Ishinaga |
| 6,507,049 B1 | 1/2003 | Yeager et al. |
| 6,705,748 B2 | 3/2004 | Morris |
| 6,707,069 B2 | 3/2004 | Song et al. |
| 6,715,901 B2 * | 4/2004 | Huang ........................ 362/294 |
| 6,828,170 B2 | 12/2004 | Roberts et al. |
| 6,897,490 B2 | 5/2005 | Brunner et al. |
| 7,038,195 B2 | 5/2006 | Kida et al. |
| 2002/0004251 A1 | 1/2002 | Roberts et al. |
| 2002/0153835 A1 | 10/2002 | Fujiwara et al. |
| 2002/0158320 A1 | 10/2002 | Takekuma |
| 2002/0163001 A1 | 11/2002 | Shaddock |
| 2003/0116769 A1 | 6/2003 | Song et al. |
| 2003/0141510 A1 | 7/2003 | Brunner et al. |
| 2003/0219919 A1 | 11/2003 | Wang et al. |
| 2004/0140765 A1 | 7/2004 | Takekuma |

(Continued)

FOREIGN PATENT DOCUMENTS

DE 10227515 A1 7/2003

(Continued)

OTHER PUBLICATIONS

German Office Action dated Aug. 18, 2005 involving German counterpart application No. 10 2004 041 211.1-33.

(Continued)

*Primary Examiner*—Sharon E Payne

(57) ABSTRACT

Embodiments of the present invention include a light emitting diode package comprising a ceramic cavity comprising a substrate for mounting a light emitting diode and substantially vertical sidewalls for reducing light leakage. The ceramic LED package further includes a metallic coating on a portion of the ceramic substrate for reflecting light in a predetermined direction.

13 Claims, 4 Drawing Sheets

U.S. PATENT DOCUMENTS

| | | |
|---|---|---|
| 2004/0240203 A1 | 12/2004 | Matsumura et al. |
| 2004/0256630 A1 | 12/2004 | Cao |
| 2005/0184387 A1 | 8/2005 | Collins et al. |
| 2006/0268579 A1 | 11/2006 | Han et al. |

FOREIGN PATENT DOCUMENTS

| | | |
|---|---|---|
| JP | 09-45965 | 3/1979 |
| JP | 60-262476 | 12/1985 |
| JP | 60262476 | 12/1985 |
| JP | 9045965 | 2/1997 |
| JP | 11-181267 | 12/1997 |
| JP | 10-107322 | 4/1998 |
| JP | 10107322 | 4/1998 |
| JP | 10-215001 | 8/1998 |
| JP | 10215001 | 8/1998 |
| JP | 2002232017 A * | 8/2002 |

OTHER PUBLICATIONS

English translation of German Office Action dated Aug. 18, 2005 involving German counterpart application No. 10 2004 041 211.1-33.

UK Search Report dated Jan. 7, 2005 involving UK counterpart application No. GB0420449.1 (References previously sent in).

* cited by examiner

CERAMIC PACKAGING FOR HIGH BRIGHTNESS LED DEVICES

TECHNICAL FIELD

The present invention relates to packaging technologies. More specifically, the present invention relates to packaging for light emitting diodes (LEDs).

BACKGROUND ART

Light emission diode packages ("LED packages") are semiconductor devices, which have LED chips acting as light sources. LEDs comprise compound semiconductor materials that produce light when electrically activated. Some examples of some compound semiconductor materials are GaAs, AlGaAs, GaN, InGaN and AlGaInP.

As an LED converts electric energy into light, it is highly efficient and far more durable, and consumes much less electricity than filament bulbs. As the practical use of LEDs gains momentum, they are becoming more widely used in displays such as the indicators for electrical appliances and the backlights for liquid crystal displays in cellular phones.

Conventional LED packages are made of plastic to keep component size and cost down. The plastic shell houses one or more LEDs and is then filled with an optically transparent material to seal and protect the LED from the environment.

One problem associated with conventional plastic LED packages is light leakage. To help make smaller LED packages, the thickness of the plastic package is reduced. As a result, the thinner packaging of the LED allows light leakage through the LED package. Light leakage makes the LED device less efficient, thus requiring more power to achieve a desired brightness, resulting in more power consumption of the device it is in. In addition, as electronic devices become smaller, LEDs must also be smaller. As a result, the smaller LED package has problems with dissipating the heat that is generated by high brightness LEDs.

SUMMARY OF THE INVENTION

Embodiments of the present invention include a light emitting diode package comprising a ceramic cavity comprising a substrate for mounting a light emitting diode and substantially vertical sidewalls for reducing light leakage. In one embodiment, the opaque nature of the ceramic material and specifically the reflective plating that prevent light leakage. The ceramic LED package further includes a metallic coating on a portion of the ceramic substrate for reflecting light in a predetermined direction.

Embodiments of the invention also include a method for manufacture of a light emitting diode package comprising forming a ceramic cavity comprising a substrate for mounting a light emitting diode and substantially vertical sidewalls for reducing light leakage. The method further includes coating a portion of the ceramic cavity with a light reflective material, positioning a light emitting diode on the substrate and depositing an optically transparent material in the cavity to protect the light emitting diode.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the various embodiments of the invention, examples of which are illustrated in the accompanying drawings. While the invention will be described in conjunction with the various embodiments, it will be understood that they are not intended to limit the invention to these embodiments. On the contrary, the invention is intended to cover alternatives, modifications and equivalents, which may be included within the invention as defined by the appended claims.

Furthermore, in the following detailed description of the invention, numerous specific details are set forth in order to provide a thorough understanding of the invention. However, it will be obvious to one skilled in the art that the invention may be practiced without these specific details. In other instances, well-known methods, procedures, components, and circuits have not been described in detail as not to unnecessarily obscure aspects of the invention.

The present invention relates to the manufacture of a ceramic LED package. The exemplary ceramic LED package of the present invention has excellent thermal properties and endurance to withstand heat from a high brightness LED device contrary to conventional plastic LED packages. The thermal properties of the ceramic package allow improvement in the brightness of LEDs without the requirement of making the package resistant to additional heat produced and without equipping the package with means for dissipating the heat quickly. The use of alumina and or aluminum nitride ceramic materials makes the ceramic LED package less susceptible to the degrading heat generated by high brightness LED devices. In addition, the ceramic package retains more light and does not allow light leakage as do conventional resin based LED packages. Such ceramic package also allows the use of high temperature during the assembly processes.

Ceramic LED packages can be made in smaller dimensions than conventional resin based LED packages and manufacturing techniques allow the sidewalls of the ceramic LED package to be formed substantially vertical, thus increasing the surface area of the ceramic cavity and allowing multiple LED devices to be mounted in a single ceramic LED package. The use of ceramic provides a more electrically efficient LED device that can be made smaller and at a lower cost.

Embodiments of the present invention are related to packaging for high brightness LED devices. In one embodiment of the invention, a ceramic substrate is used to reduce light leakage in a high brightness LED to improve efficiency of the LED. Reducing the amount of light leakage reduces the amount of power required to achieve a desired brightness. In addition to a ceramic package substrate, embodiments of the present invention provide a ceramic LED package that is coated with a light reflective material to further increase light intensity and to further reduce light leakage.

Figure 1:
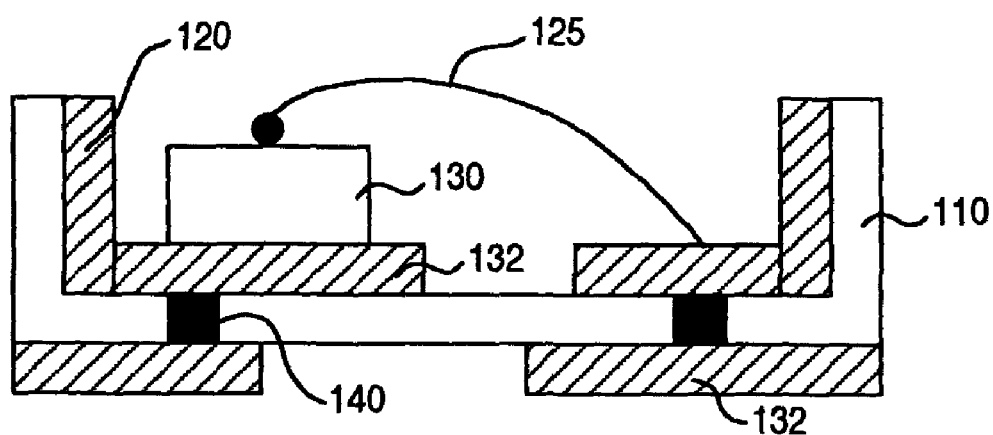
FIG. 1 is a side view illustration of an exemplary ceramic LED package comprising an light reflective coating in accordance with embodiments of the present invention.

FIG. 1 is an illustration of an exemplary ceramic light emitting diode package in accordance with embodiments of the present invent. Ceramic package 100 comprises a ceramic substrate 110 with substantially vertical sidewalls. In accordance with embodiments of the present invention, the ceramic package 110 contains and focuses light more effectively than a conventional package made from plastic. In one embodiment of the invention, the ceramic package is coated with a light reflective material to further improve efficiency of the LED by reflecting light in a predetermined direction. By reflecting light in a particular direction, less power is needed to produce a desired brightness in a particular direction. In a conventional LED package, light leaks through the sidewalls and therefore require more power to achieve a desired brightness.

In one embodiment of the present invention, ceramic package 100 comprises electrical connections 140 to electrically couple LED 130 to a first portion of metal routing 132 on the inside of the ceramic package and the outside of the ceramic package. In addition, a wire bond 125 can be used to electrically couple LED 130 to a second portion of metal routing 132.

The present invention provides a ceramic LED packaging to reduce light leakage of a high brightness LED. In addition to reducing light leakage, a ceramic package allows the dimensions of the package to be scaled down. In accordance with embodiments of the present invention, a ceramic LED package can be made in smaller dimensions than a conventional plastic LED package. In addition, the contour of the sidewalls of the ceramic package can be manufactured such that the sidewalls are substantially vertical. In a conventional LED package, the sidewalls are not vertical (e.g., slopping from the top of the package to the bottom of the package) because the manufacture of plastic LED packages produces sidewalls that are not vertical, thus reducing the area on the bottom of the package. In one embodiment of the present invention, the ceramic LED package comprises vertical sidewalls, thus increasing the surface area of the bottom of the package given a particular device dimension.

In one embodiment of the present invention, the ceramic LED package 110 is plated with metal to form a light reflective coating on the inner surface of the ceramic package 110. In one embodiment of the invention, the metallic plating is silver or gold, but the plating can be any light reflective material that can be deposited on the surface of the ceramic package 110. In one embodiment of the invention, silver is electro plated on the surface of the ceramic package. It is appreciated that any process well known can be used to coat the ceramic package 110 with the light reflective material 120.

In one embodiment of the invention, the light reflective material is formed in specific locations to reflect light in a predetermined direction. As such, these locations may not be electrically connected to the metal routing 132.

FIGS. 2A-2D are illustrations of an exemplary ceramic LED package during different processing steps in accordance with embodiments of the present invention. For clarity, exemplary process 300 of FIG. 3 will be described in conjunction with FIGS. 2A-2D.

Figure 2A:
FIGS. 2A-2D are side view illustrations of an exemplary ceramic LED package during several processing steps in accordance with embodiments of the present invention.

FIG. 2A is a side view illustration of an exemplary ceramic LED package 110 in accordance with embodiments of the present invention. In one embodiment of the invention, the ceramic material used to form the ceramic package 110 is an alumina or aluminum nitride based ceramic material. Alumina and aluminum nitride based ceramics tolerate extreme heat and offers more efficient heat dissipation qualities than conventional plastic or resin based materials, thereby providing a greater degree of brightness of the LED device. It is appreciated that the ceramic material can be any ceramic material suitable for use with a high brightness LED device. In one embodiment of the invention, the ceramic material used to form the ceramic package 110 comprises physical properties that facilitate electroplating of metallic materials to the ceramic surface.

Figure 3:
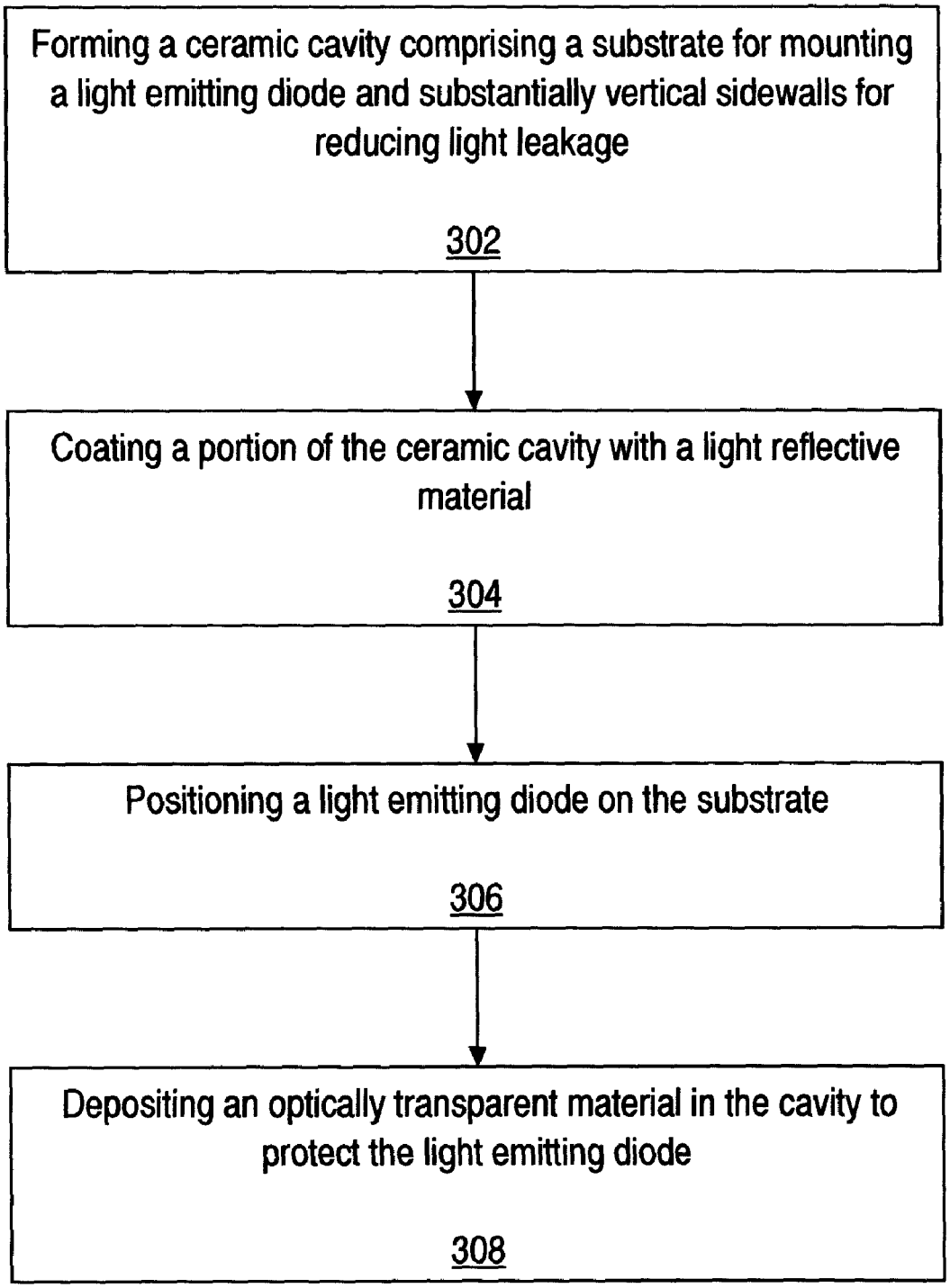
FIG. 3 is flow diagram of an exemplary process for manufacturing a ceramic LED package in accordance with embodiments of the present invention.

In one embodiment of the invention, multiple ceramic packages 110 are formed in sheets wherein multiple ceramic packages are formed at once. In one embodiment, the ceramic packages are formed using a die that can be stamped on a sheet of ceramic material to form the ceramic LED package 110. In accordance with the present invention, the sidewalls of the ceramic package 110 are substantially vertical, thus providing maximum surface area on the bottom of the ceramic package 110 for mounting multiple LED devices. By using ceramic material to form the package 110, the dimensions of the package can be smaller than conventional LED packages, thus reducing the footprint of a device that achieves a desired brightness level. Step 302 of FIG. 3 is forming a ceramic cavity comprising a substrate for mounting a light emitting diode and substantially vertical sidewalls for reducing light leakage. Many different methods for forming the ceramic package 110 can be used and the methods for forming small ceramic packages are well known in the art.

Figure 2B:

FIG. 2B is a side view illustration of an exemplary ceramic LED package coated with a light reflective material in accordance with embodiments of the present invention. After the ceramic package 110 is formed, step 304 of exemplary process 300 of FIG. 3 is coating a portion of the ceramic cavity with a light reflective material. FIG. 2B illustrates light reflective coating 120 on portions of the ceramic package 110 in accordance with embodiments of the present invention. In one embodiment of the invention, the light reflective coating is silver metal. It is appreciated that the light reflective coating can be any light reflective material that can be coated on portions of the ceramic package 110.

In one preferred embodiment of the present invention, the light reflective coating is metallic and is electro plated on the ceramic LED package 110. In one embodiment of the invention, the light reflective coating 120 is an opaque metallic coating. The light reflective coating increases the total light intensity and flux the LED. In addition, the light from the LED can be focused in a predetermined location thus further increasing the efficiency of the device in a specific direction.

Figure 2C:
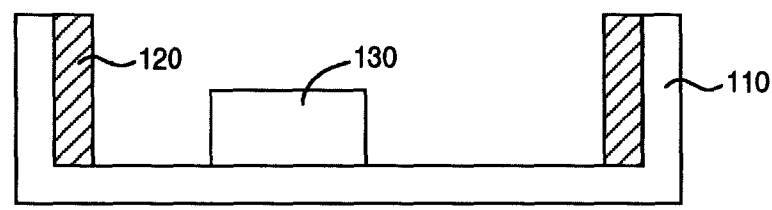
Figure 2D:
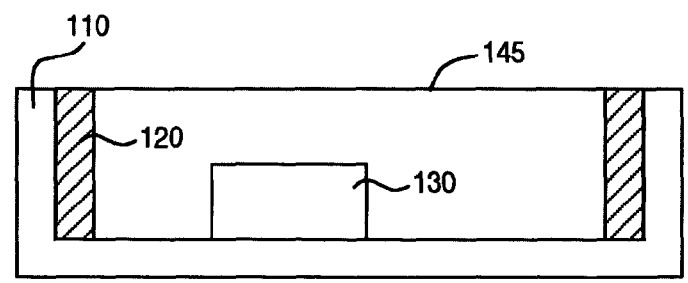

FIG. 2C is a side view illustration of an exemplary ceramic package with a light reflective coating and an LED device in accordance with embodiments of the present invention. Step 306 of exemplary process 300 of FIG. 3 is to position a light emitting diode on the ceramic substrate of the ceramic package in accordance with embodiments of the present invention. FIG. 2C illustrates a LED 130 positioned on the bottom surface of the ceramic LED package 110. After the light reflective coating 120 is formed on the vertical sidewalls of the ceramic package 110, the LED can be positioned on the substrate. In one embodiment of the invention, multiple LED devices are positioned in a single ceramic LED package. As a result of the vertical sidewalls of the ceramic package 110, sufficient area on the substrate surface is available to position multiple LED devices.

As illustrated in FIG. 1, multiple electrical connectors 140 are located in ceramic package 110 to electrically couple LED 130 to an outside power source. The electrical connectors 140 are not illustrated in FIGS. 2A-2D for clarity, but it is appreciated that in one embodiment of the invention, electrical connectors are located in the ceramic package 110 to electrically couple LED 130 to a power source. A metal routing 132 may also be provided for this purpose. FIG. 2C illustrates the reflective coating 120 on the sidewalls of the ceramic package 110. In one embodiment of the invention, the reflective coating is formed in specific locations on the ceramic package to focus light in a predetermined location. For example, the light reflective coating may be formed on the bottom surface of the ceramic package 110.

After the LED is positioned in the ceramic LED package, the next step of exemplary process 300 of FIG. 3 is step 308 which includes depositing an optically transparent material 145 in the cavity the ceramic LED package 110 to protect the LED 130. In one embodiment of the present invention, the optically transparent material 145 is epoxy. The optically transparent material 145 protects the LED device 130 from environmental factors such as vibration, water and dust contamination. The optical properties of the material allow light emitted from the LED device to pass through the material without substantial loss of brightness. Other optically transparent materials such as silicone and glass can also be used.

Figure 4:
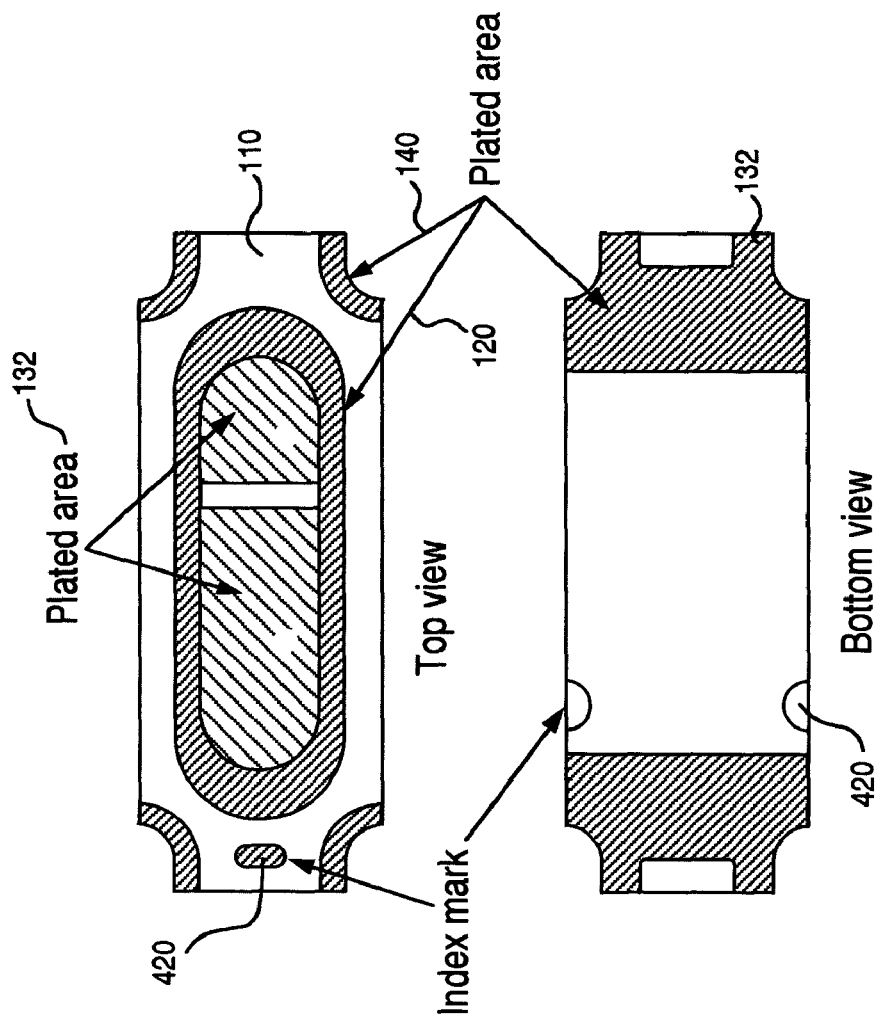
FIG. 4 is a top and bottom view of an exemplary ceramic LED package in accordance with embodiments of the present invention.

FIG. 4 illustrates a top view and a bottom view of an exemplary ceramic LED package 100 in accordance with embodiments of the present invention. LED package 100 comprises a ceramic package 110 comprising a cavity that comprises a plated area 120 for reflecting light from an LED in a predetermined direction. In addition, exemplary LED package 100 comprises electrical connectors 140 for electrically coupling an LED device (not shown for clarity) to a power source. In one embodiment of the invention, the ceramic package 110 is rectangular shaped with an oval shaped cavity in the middle of the package. The oval cavity has substantially vertical sidewalls that are plated with a light reflective coating 120 to direct light from an LED in a predetermined direction to improve the brightness and efficiency of the LED, thus decreasing the required power to achieve a desired brightness. To aid in manufacturing, index marks 420 are provided to aid in positioning in various steps of the manufacture process. On the bottom view, the plated area 132 is used to rout electrical power to the LED device. In one embodiment of the invention, the LED package 100 is a surface mountable device.

In summary, the ceramic LED package has excellent thermal properties and endurance to withstand heat from a high brightness LED device contrary to conventional plastic LED packages. The thermal properties of the ceramic package allow improvement in the brightness of LEDs without the requirement of making the package resistant to additional heat produced and without equipping the package with means for dissipating the heat quickly. The use of alumina and or aluminum nitride ceramic materials makes the ceramic LED package less susceptible to the degrading heat generated by high brightness LED devices. Such ceramic package also allows the use of high temperature during the assembly processes. In addition, the ceramic package retains more light and does not allow light leakage as do conventional resin based LED packages.

Ceramic LED packages can be made in smaller dimensions than conventional resin based LED packages and manufacturing techniques allow the sidewalls of the ceramic LED package to be formed substantially vertical, thus increasing the surface area of the ceramic cavity and allowing multiple LED devices to be mounted in a single ceramic LED package. The use of ceramic provides a more electrically efficient LED device that can be made smaller and at a lower cost.

Embodiments of the present invention, ceramic package for high brightness LED devices has been described. While the present invention has been described in particular embodiments, it should be appreciated that the present invention should not be construed as limited by such embodiments, but rather construed according to the following Claims.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A standalone light emitting diode package, comprising:
   a housing comprising substantially vertical sidewalls and a substrate, the sidewalls and the substrate defining a cavity having a bottom, the substrate being located at the bottom of the cavity, the substrate and the vertical sidewalls being contiguous, continuous and uninterrupted respecting one another at the intersections thereof, the housing forming a single unitary piece of ceramic;
   at least one light-reflective metallic coating disposed over at least portions of the sidewalls and the substrate;
   a light emitting diode mounted on or in the substrate, and an optically transparent material disposed in the cavity and covering the light emitting diode;
   wherein the ceramic composition and configuration of the housing and the light-reflective coating cooperate to minimize light leakage through, into or out of the housing when the light emitting diode is energized, the metallic coating reflects light incident thereon in a predetermined direction, and the optically transparent material protects the light emitting diode.

2. The light emitting diode package of claim 1 wherein said cavity is substantially white in color.

3. The light emitting diode package of claim 1 wherein said metallic coating comprises silver.

4. The light emitting diode package of claim 1 wherein said metallic coating comprises gold.

5. The light emitting diode package of claim 1 wherein said metallic coating is formed by plating.

6. The light emitting diode package of claim 1 wherein said cavity is formed to contain a plurality of light emitting diodes.

7. A method of making a standalone light emitting diode package, the package comprising a housing having substantially vertical sidewalls and a substrate, the sidewalls and the substrate defining a cavity having a bottom, the substrate being located at the bottom of the cavity, the substrate and the vertical sidewalls being contiguous, continuous and uninterrupted respecting one another at the intersections thereof, the housing forming a single unitary piece of ceramic, at least one light-reflective metallic coating being disposed over at least portions of the sidewalls and the substrate, a light emitting diode being mounted on or in the substrate, an optically transparent material being disposed in the cavity and covering the tight emitting diode, the ceramic composition and configuration of the housing and the light-reflective coating cooperating to minimize light leakage through, into or out of the housing when the light emitting diode is energized, the metallic coating reflecting light incident thereon in a predetermined direction, and the optically transparent material protecting the light emitting diode, the method comprising:

(a) stamping the housing from the unitary piece of ceramic;

(b) coating the at least portions of the sidewalls and substrate with the at least one light-reflective metallic coating;

(c) mounting the light emitting diode on or in the substrate, and (d) depositing the optically transparent material in the cavity.

8. The method as described in claim 7 wherein said cavity is substantially white in color.

9. The method as described in claim 7 wherein said light reflective material comprises silver.

10. The method as described in claim 7 wherein said light reflective material comprises gold.

11. The method as described in claim 7 wherein said reflective coating is formed using plating.

12. The method as described in claim 7 wherein said cavity is configured to mount a plurality of light emitting diodes therein.

13. The method as described in claim 7 further comprising depositing epoxy as the optically transparent material in the cavity.

\* \* \* \* \*